United States Patent [19]
Frisch

[11] Patent Number: 5,949,284
[45] Date of Patent: Sep. 7, 1999

[54] CMOS BUFFER AMPLIFIER

[75] Inventor: Arnold M. Frisch, Portland, Oreg.

[73] Assignee: Tektronix, Inc., Wilsonville, Oreg.

[21] Appl. No.: 08/968,056

[22] Filed: Nov. 10, 1997

[51] Int. Cl.$^6$ .................................................. H03F 3/45
[52] U.S. Cl. ........................ 330/253; 330/255; 330/260
[58] Field of Search .............................. 330/69, 124 R, 330/252, 253, 255, 260, 295

[56] References Cited

U.S. PATENT DOCUMENTS

| | | |
|---|---|---|
| 4,422,051 | 12/1983 | Katakura et al. . |
| 4,430,621 | 2/1984 | Wieser et al. . |
| 4,542,308 | 9/1985 | Wincn . |
| 4,549,146 | 10/1985 | Cowans et al. . |
| 4,730,168 | 3/1988 | Senderowicz et al. . |
| 4,958,132 | 9/1990 | Plants . |
| 5,418,470 | 5/1995 | Dagostino et al. . |
| 5,430,335 | 7/1995 | Tanoi . |
| 5,583,447 | 12/1996 | Dascher . |
| 5,621,357 | 4/1997 | Botti et al. ............................... 330/253 |

*Primary Examiner*—James B. Mullins
*Attorney, Agent, or Firm*—Boulden G. Griffith; Thomas F. Lenihan

[57] ABSTRACT

A CMOS buffer amplifier can accept input signals and produce output signals that are within one half of the enhancement threshold voltage of the power supply voltages. These characteristics make this buffer amplifier ideal for use with low voltage CMOS circuitry with sub-micron geometries. The buffer amplifier contains two differential amplifiers, the output of both being combined and coupled to an output node. Each differential amplifier has matched input transducing devices on each of its inputs. One of these couples the input of the buffer amplifier to one of the inputs of the differential amplifier, while the other one couples the output of the buffer amplifier as feedback to the other side of the same differential amplifier. The pair of input transducing devices providing input to one differential amplifier are matched and suitable for operation in a higher voltage range than are the matched pair providing input to the other differential amplifier. These two ranges of operation overlap in a voltage region around the center of the overall input range of the buffer amplifier, but collectively they extend the overall range of inputs that the buffer amplifier can accept. Ideally, the buffer amplifier has an overall gain of one and exhibits a substantially linear transfer function. However, if a somewhat less linear transfer function is acceptable, the overall gain of the buffer amplifier can be reduced, thereby extending the range of input signals that can be sensed.

35 Claims, 4 Drawing Sheets

CM OS BUFFER AMPLIFIER

FIELD OF THE INVENTION

This invention relates to the design of CMOS buffer amplifiers that are suitable for use in analog probes used in embedded testing of integrated circuit designs, and more particularly to the design of such buffer amplifiers that are suitable for use in low voltage environments and sub-micron geometry integrated circuit processes, and which can reliably replicate input signals the voltage extremes of which are very close to the voltages of the source and drain supplies available to the amplifier.

BACKGROUND OF THE INVENTION

U.S. Pat. No. 5,418,470 to Dagostino et al. for "Analog Multi-channel Probe System", hereby incorporated by reference, discloses a programmable analog multi-channel probe system that is suitable for embedding within an integrated circuit to be tested and for coupling test points from within that circuit to external measurement points. Programmable input buffer amplifiers, when enabled, couple the signals present at the test points on their inputs to respective routers for output. Each output of the routers is coupled to the input of an output buffer amplifier. The data at the output of those buffer amplifiers is converted to a differential signal for transmission by differential input/output amplifiers to the external measurement points. Each of the differential input/output amplifiers have selectable reference levels, including internal and external reference levels., that are used to increase their dynamic range or, in the case of the local ground signal, to improve their signal to noise ratio.

To implement analog probes for embedded testing, as shown in the U.S. Pat. No. 5,418,470 patent above, using the latest low voltage sub-micron CMOS (Complementary Metal Oxide on Silicon) circuitry and minimizing power consumption, it would be highly advantageous to have available CMOS buffer amplifiers that can both sense and drive signals having peak amplitudes that are close to the source and drain voltage rails, $V_{SS}$ and $V_{DD}$, even when those voltages are relatively small and close together.

U.S. Pat. No. 4,730,168 to Senderowiez et al. for "CMOS Output Stage With Larger Voltage Swing and with Stabilization of the Quiescent Current", hereby incorporated by reference, describes an output stage capable of driving voltages close to the power supply rails. However, because this circuit as shown is a unity gain amplifier and the input stage is incapable of accepting input voltages that are close to the power supply rail voltages, the output voltage range is in practice to some degree limited.

BRIEF SUMMARY OF THE INVENTION

The present invention provides a CMOS buffer amplifier that can sense input signals and produce output signals that are very close to the values of the power supply voltages available to the amplifier, and which can do so with a substantially linear transfer function. These characteristics make this buffer amplifier ideal for use with low voltage CMOS circuitry. In a described implementation, the buffer amplifier contains two differential amplifiers, the output of each being coupled to an output signal node via respective pull-up and pull-down circuits, or, more generally, signal combining circuitry. Each differential amplifier has matched input transducing devices on each of its inputs. In the described implementation, these input transducing devices are voltage-to-current converters. One of these input transducing devices couples the input of the overall buffer amplifier to one of the inputs of the associated differential amplifier, while the other couples the output of the overall buffer amplifier as feedback to the other side of the same differential amplifier The input transducing devices associated with one of the differential amplifiers are designed for operation in a higher voltage range than are those associated with the other, although these two ranges of operation overlap across a voltage region that embraces the center of the input voltage range and is large enough to accommodate the enhancement threshold voltages of the CMOS devices used in the buffer amplifier circuit. In a preferred embodiment, this buffer amplifier has an overall gain of one and exhibits a substantially linear transfer function. And, because the pair of input transducing devices that provide the input to one of the differential amplifiers are suitable for operating on higher than nominal inputs, while the other pair of input transducing devices that provide the input to the other differential amplifier are suitable for operating on lower than nominal inputs, the overall range of input signals that the buffer amplifier can track extends from about one half of the P-channel enhancement threshold voltage below the positive voltage supply, $V_{DD}$, to about one half of the N-channel enhancement threshold voltage above the negative voltage supply, $V_{SS}$. In an alternative embodiment, the overall gain of the buffer amplifier is reduced and the range of input signals that can be sensed is further extended, although doing so somewhat reduces the linearity of the transfer function.

DETAILED DESCRIPTION OF THE INVENTION

Figure 1:
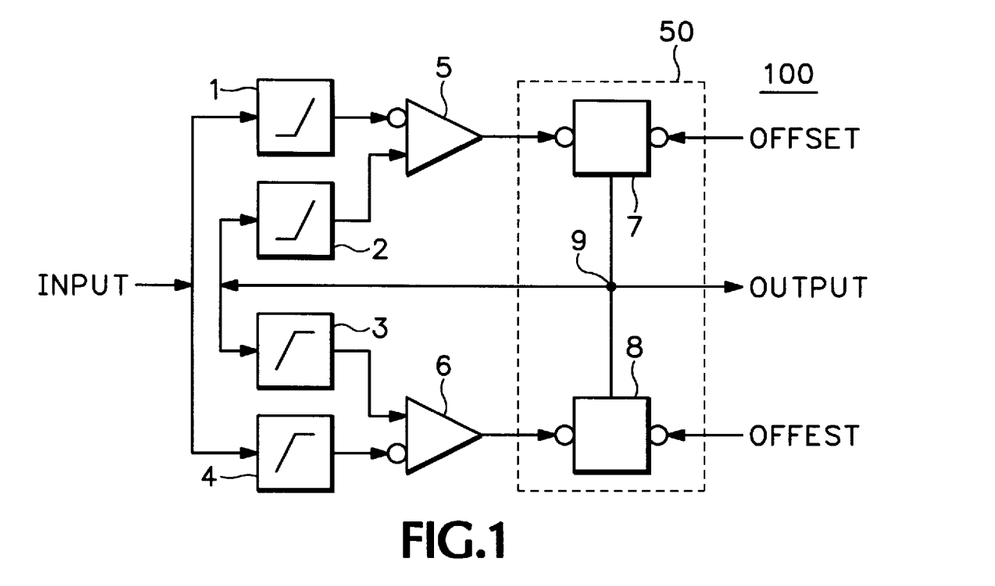
FIG. 1 is a block diagram of a CMOS buffer amplifier according to the present invention.

FIG. 1 is a block diagram of a CMOS buffer amplifier 100 according to the present invention. The input signal to the buffer amplifier 100 is applied to input transducing devices 1 and 4, which in this implementation are voltage-to-current converters. The outputs of these input transducing devices, 1 and 4, are applied to the negative inputs of differential amplifiers 5 and 6, respectively. The signal at the output node 9 of the buffer amplifier 100 is provided as feedback to the inputs of input transducing devices 2 and 3, the outputs of which are connected to the positive inputs of differential amplifiers 5 and 6, respectively.

The output of differential amplifier 5 is applied to the input of pull-up circuit 7, the output of which is connected to the output node 9 of the buffer amplifier 100. The output of differential amplifier 6 is applied to the input of pull-down circuit 8, the output of which is also connected to the output node 9. As will be further described below, the nominal mid-range level of the output signal at output node 9 can be adjusted by an offset signal applied to the offset inputs of pull-up circuit 7 and pull-down circuit 8. The output signal at output node 9 has the opposite sense from both the signal and offset inputs to the pull-up circuit 7 and pull-down circuit 8.

More generally, the outputs of differential amplifiers 5 and 6 are combined by signal combining circuitry 50, which alternatively might be, for example, an inverting summing amplifier. However constructed, the output of that signal combining circuitry 50 supplies the signal at the output node 9.

It should also be noted that, while in this implementation the input transducing devices 1–4 are voltage-to-current converters, in other implementations they could be current-to-current, current-to-voltage, voltage-to-voltage, voltage-to-impedance, current-to-impedance, optical-to-current, optical-voltage, optical-to-impedance, or any other type of converting or amplifying devices that are capable of serving the same or similar function in this context.

In a preferred embodiment of the invention, the four input transducing devices 1,2,3,4 are all designed to have matched gain characteristics. Input transducing devices 1 and 2 are designed to have similar non-linearities, as are input transducing devices 3 and 4. However, input transducing devices 1 and 2 are designed to be active over a different voltage range than are input transducing devices 3 and 4. These two ranges are chosen to provide an overlap region that is symmetrically disposed around the intermediate point between the two supply voltages and to be large enough to permit voltage changes within this range that can accommodate the largest of enhancement thresholds of the CMOS devices used within the buffer amplifier 100 and the circuitry that provides its input signal. Above this overlap voltage region only input transducing devices 1 and 2 are active, while below this overlap region only input transducing devices 3 and 4 are active. Within this overlap region both sets of input transducing devices 1,2,3,4 are active, but in inverse amounts that sum to a constant gain.

Differential amplifiers 5 and 6, and pull-up and pull-down circuits 7 and 8, are also designed to have similar gain and other characteristics. Thus, the top half of this circuit, comprising input transducing devices 1 and 2, differential amplifier 5, and the pull-up circuit 7, is matched as closely as possible with the bottom half of this circuit, comprising input transducing devices 3 and 4, differential amplifier 6, and the pull-down circuit 8.

When the voltage gain of the buffer amplifier 100 is made to be one, as it is in a preferred embodiment, the overall transfer function is maximally linear. Reducing the gain of buffer amplifier 100 (e.g. by increasing the size of transistors 15 and 16) will expand the range of input voltages that it can sense and track at its output. This will adversely affect the linearity of the overall transfer function to some degree, but for some applications that may be an acceptable tradeoff.

Figure 2A:
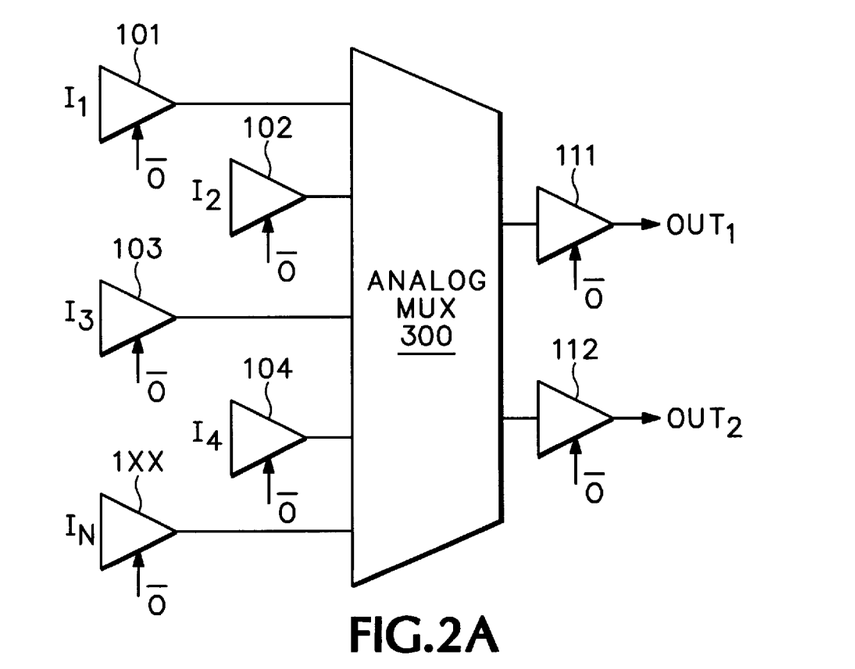
FIG. 2A is a block diagram of analog probe circuitry suitable for embedded testing application and containing multiple instances of the buffer amplifier according to the present invention as shown in FIG 1.

FIG. 2A is a block diagram of analog probe circuitry suitable for embedded testing applications and containing multiple instances of the buffer amplifier 100 according to the present invention as shown in FIG. 1. In this figure, the CMOS buffer amplifier 100 of FIG. 1 is shown in several instances, 101–1XX, 110, 111 and 112. Instances 101 to 1XX buffer inputs to an analog multiplexer 300, while instances 111 and 112 buffer a pair of outputs from that multiplexer. Typically, instances 111 and 112 of the buffer amplifier 100 would be designed to supply more current at their outputs than would instances 101–1XX and 110.

Figure 2B:
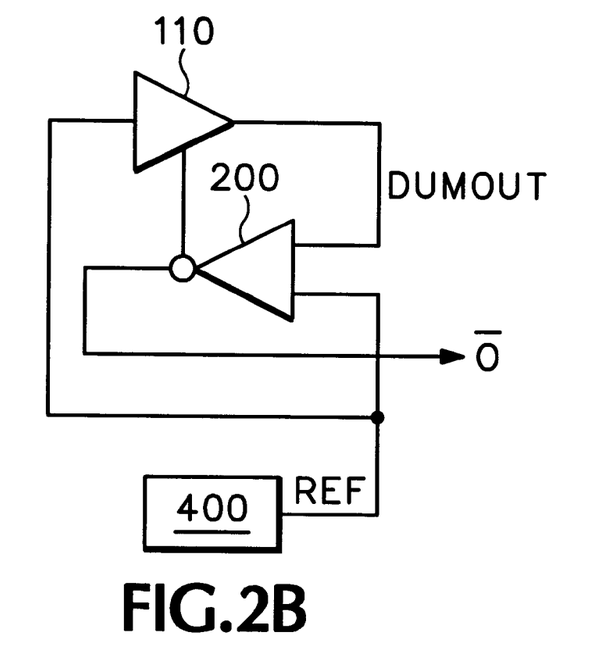
FIG. 2B is a block diagram of a dummy buffer amplifier and an offset generating amplifier in a loop configuration, with input from a reference voltage generator.
Figure 2C:
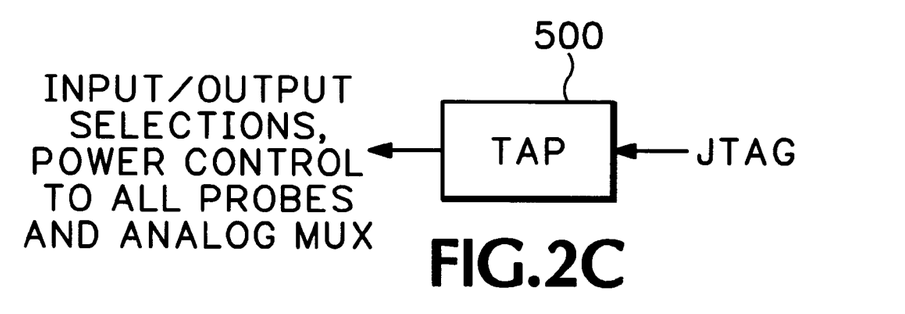
FIG. 2C is a block diagram of the test control circuitry used to operate or disable the circuitry summarized in FIGS. 2A and 2B, and detailed in FIGS. 3 and 4.

FIG. 2B is a block diagram of the circuitry which produces the offset signal, /O which is an input to all of the buffer amplifiers 100 shown in FIG. 2A. This circuitry will be more fully described below. FIG. 2C is a block diagram of test control circuitry that selects the outputs of analog multiplexer 300, and enables or disables all of the buffer amplifiers 101–1XX, 110, 111 and 112, and the analog multiplexer. The boundary scan test access port (TAP) 500 receives commands and test data, and produces multiplexer control signals and enable signals for the channels that are to be selected.

Figure 3:
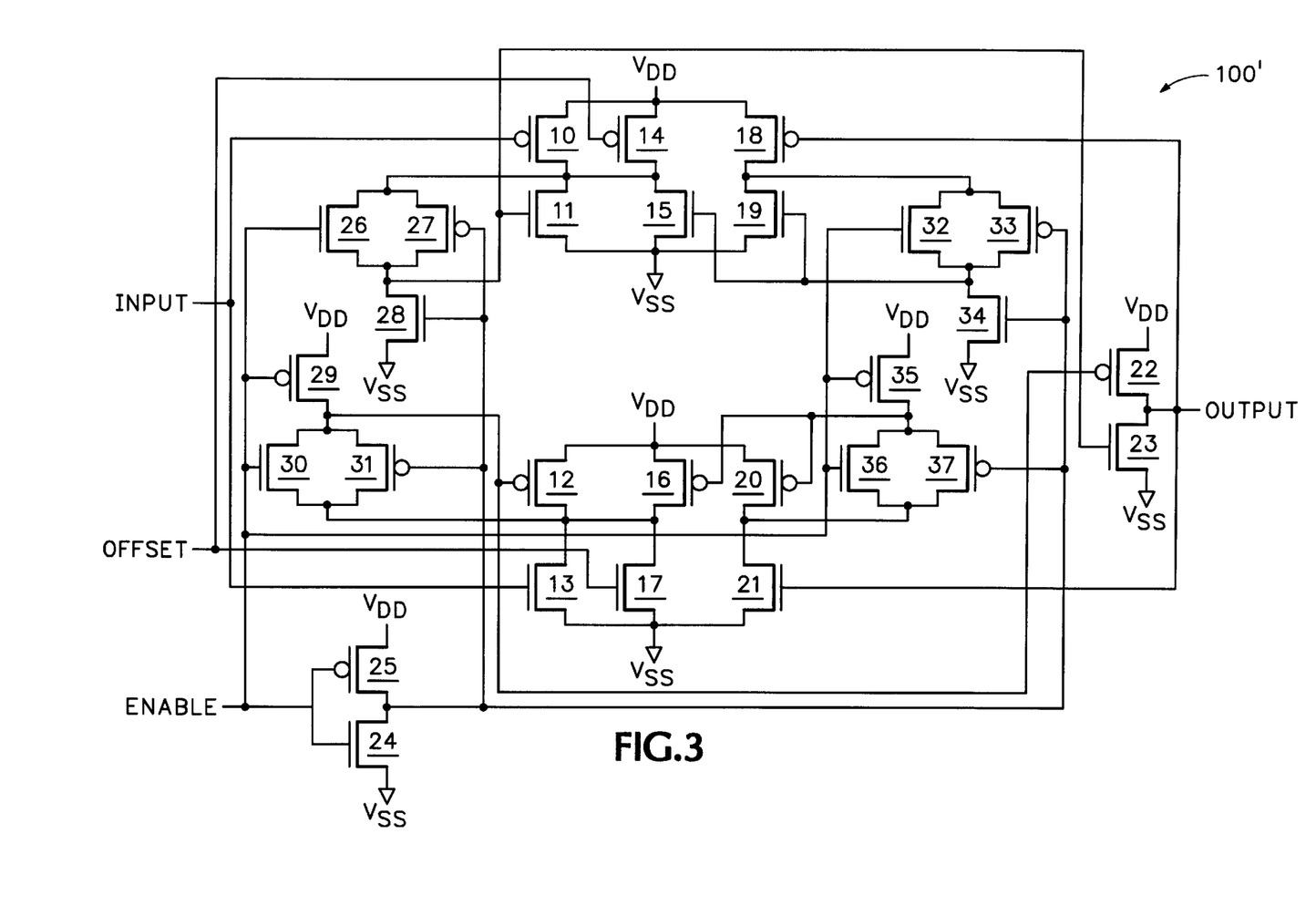
FIG. 3 is a schematic diagram showing in detail a preferred embodiment of the buffer ampler according to the present invention.

FIG. 3 is a schematic diagram showing in detail the buffer ampler 100' according to the present invention.. While the simplified block diagram version of this buffer amplifier in FIG. 1 was identified as 100, the somewhat more elaborate version shown in FIG. 3 is identified as 100'. The only difference between the two is circuitry relating to how the buffer amplifier 100' is enabled or disabled. When the buffer amplifier 100' is disabled, all current flow is shut off to conserve power. Since this circuitry is intended for use in embedded testing applications, it will normally be used for only a limited amount of time and therefor eliminating excess power consumption is important the rest of the time.

Referring to FIGS. 1 and 3, the input transducing devices 1 and 2 correspond to N-channel transistors 13 and 21, respectively. Differential amplifier 5 corresponds to P-channel transistors 12, 16, and 20. Pull-up circuit 7 corresponds to N-channel transistor 17 and P-channel transistor 22. Similarly, the input transducing devices 3 and 4 correspond to P-channel transistors 18 and 10, respectively. Differential amplifier 6 corresponds to N-channel transistors 11, 15, and 19. Pull-down circuit 8 corresponds to P-channel transistor 14 and N-channel transistor 23. The offset voltage is applied to the gates of P-channel transistor 14 and N-channel transistor 17.

Returning for the moment to FIG. 1, as an example to illustrate some typical values, let us assume an environment in which $V_{SS}$ is 0.0V and $V_{DD}$ is 3.3V. The voltage level intermediate to these supply voltages is 1.65V, and we will assume that it is the desired center of our buffer amplifier's input signal range. This voltage then becomes the value around which the overlap region between the voltage ranges of the two sides of the buffer amplifier (i.e., the input voltage range of input transducing devices 1 and 2 and the input voltage range of input transducing devices 3 and 4) is to be centered.

As an example, in a particular implementation, using a particular process, and in one particular fabrication run, an offset signal having a voltage value of 1.34V might be generated and supplied to the offset input. The application of this offset voltage value to the gates of transistors 14 and 17 will accomplish the goal of setting the center voltage of the input range to 1.65V. In particular, this will cause the two sides of the buffer amplifier to be equally active when the input signal is 1.65V. As the voltage of the input signal increases above 1.65V, the top half of the buffer amplifier shown in FIG. 1 will become more active and the bottom half will tend toward shutting off. Conversely, when the input voltage goes below 1.65V, the top half of the buffer amplifier shown in FIG. 1 will begin to shut off and the bottom half will begin to become increasingly more active.

For example, if the P-channel enhancement threshold voltage is 0.9V and the N-channel enhancement threshold voltage is 0.75V, with $V_{SS}$ equal to 0.0V and $V_{DD}$ equal to 3.3V, then the overlap region will extend from 0.75V to 2.4V. Thus, one set of input transducing devices, 3 and 4, will be the only ones operating while the input varies from 0V to 0.75V. Similarly, the other set of input transducing devices, 1 and 2, will be the only ones active while the input signal varies from 2.4V to 3.3V. In the central overlap region, from 0.75V to 2.4V, both pairs of input transducing devices will share the feedforward and feedback functions, with each of them acting to a complementary degree.

The rest of the circuitry shown in FIG. 3, transistors 24–37, is provided to shut down the functional circuitry described above and prevent current consumption when the buffer amplifier 100' is not is use. When the buffer amplifier 100' is to be made active, the enable signal goes positive, i.e.., to $V_{DD}$. That positive voltage on the gate of P-channel transistor 25 turns it off, while the same positive voltage on the gate of N-channel transistor 24 turns it on. With transistor 25 off and 24 on, the node on the drain of transistor 25 and the drain of transistor 24 goes low, and that low is applied to the gates of P-channel transistors 27, 31, 33, and 37, turning them all on, as well as the gates of N-channel transistors 28 and 34, turning them off. The positive enable voltage is also applied to the gates of N-channel transistors 26, 30, 32, and 36, turning them on, as well as to the gates of P-channel transistors 29 and 35, turning them off.

With transistors 26 and 27 on, and transistor 28 off, the node at the drains of transistors 11 and 15, and 10 and 14 is connected to the gate of transistors 11 and 23, thereby allowing transistor 11 to operate as diode-connected between that node and $V_{SS}$, and connecting that node to the gate of transistor 23. Similarly, when the enable signal is high, the operation of transistors 32, 33, and 34 diode connects transistor 19, and connects the node at the drains of transistors 18 and 19 to the gate of transistor 15. And, in the same manner, the operation of transistors 29, 30, and 31, and 35, 36, and 37, cause comparable effects on the other side of the buffer amplifier 100'.

When the buffer amplifier 100' is to be made inactive and the current consumption reduced to negligible, the enable signal is made to go negative, i.e., to $V_{SS}$. That negative voltage on the gate of P-channel transistor 25 turns it on, while the same negative voltage on the gate of N-channel transistor 24 turns it off. With transistor 25 on and 24 off, the node on the drains of transistors 24 and 25 goes high, and a high is applied to the gates of P-channel transistors 27, 31, 33, and 37, turning them all off, as well as the gates of N-channel transistors 28 and 34, turning them on. The negative enable voltage is also applied to the gates of N-channel transistors 26, 30, 32, and 36, turning them off, as well as to the gates of P-channel transistors 29 and 35, turning them on.

With transistors 26 and 27 off, and transistor 28 on, the node at the drains of transistors 11 and 15 and at the drains of transistors 10 and 14 is disconnected from the gate of transistors 11 and 23, and those gates instead receive $V_{SS}$ through transistor 28. That low turns those N-channel transistors off, preventing any current flow in that side of that differential amplifier or the pull-down circuit side of the output node. Similarly, when the enable signal is low, the operation of transistors 32, 33, and 34 disconnects the node at the drain of transistors 18 and 19 from the gates of transistors 15 and 19, and instead supplies those gates with a low, $V_{SS}$, turning them off, thereby preventing any current flow through those legs of the differential amplifier. And, in the same manner, the operation of transistors 29, 30, and 31, and 35, 36, and 37, cause comparable effects on the other side of the buffer amplifier 100', shutting off all current flow through that differential amplifier and the pull-up circuit side of the output node. Thus, the operation of the circuitry controlled by the enable signal shuts off all current flow in the buffer amplifier 100' and puts its output in a high impedance state.

Because CMOS transistors become less and less "ideal" as their gate lengths decrease and their implant doses increase, some of the transistor sizes shown in FIG. 3 differ from the values that they would have in an embodiment intended for use in processes with geometries above one micron. In particular, the drain output impedance falls so that the drain current is no longer independent (to first order approximation) from the drain voltage. This means that current mirrors are much harder to construct than they were in older, longer gate length processes. To compensate for this, instead of constructing the differential amplifiers 1 and 2 with transistors 11, 15, 19, and 13, 17, 21 having the same gate widths, the gate widths of transistors 19 and 15, and 17 and 21, are increased by a factor of four. This reduces the variation of drain current with drain voltage in transistors 19 and 21, and thereby improves the performance of the current mirrors and differential amplifiers that they are part of.

In an alternative embodiment of the invention that might be preferable in some applications, the pull-up circuit 7 and the pull down circuit 8 shown in FIG. 1 could be made more complex to provide programmably controllable output impedances. Referring to FIG. 3, transistors 22 and 23 could each be replaced by multiple parallel transistors of the same type (P- or N-), with each of those multiple transistors having gate width sizes that bear a binary exponential (power-of-two) relationship to each other. With additional control circuitry (e.g., transmission gates) to selectively activate each transistor separately, and with corresponding control signals to operate that circuitry, these transistors could be selectively activated in various combinations to produce a wide range of desired output impedances. Naturally, the P-channel transistors substituting for transistor 22 and the N-channel transistors substituting for transistor 23 would have to have the same 2.5:1 size ratio that is shown in the Table below for transistors 22 and 23. And, to achieve balanced operation, the selections for activation of transistors on the pull-up and pull-down sides would have to be the same.

The Table below provides the channel widths of the transistors shown in FIGS. 3 and 4, as they were omitted for clarity:

TABLE

WIDTHS OF TRANSISTOR CHANNELS

10 - 3.2 μ
11 - 1.6 μ
12 - 4.0 μ
13 - 2.0 μ
14 - 1.6 μ
15 - 6.4 μ
16 - 16.0 μ
17 - 1.0 μ
18 - 3.2 μ
19 - 6.4 μ
20 - 16.0 μ
21 - 2.0 μ
22 - 1000 μ
23 - 400 μ
24 - 2.0 μ

TABLE-continued

WIDTHS OF TRANSISTOR CHANNELS

25 - 2.0 μ
26 - 2.0 μ
27 - 2.0 μ
28 - 2.0 μ
29 - 2.0 μ
30 - 2.0 μ
31 - 2.0 μ
32 - 2.0 μ
33 - 2.0 μ
34 - 2.0 μ
35 - 2.0 μ
42 - 3.2 μ
37 - 2.0 μ
38 - 2.0 μ
39 - 4.0 μ
40 - 2.0 μ
41 - 5.0 μ
42 - 3.2 μ
43 - 3.2 μ
44 - 3.2 μ
45 - 2.0 μ
46 - 2.0 μ
47 - 2.0 μ
48 - 2.0 μ
49 - 2.0 μ

In FIG. 2A, the offset signal, /O, is shown as an offset input to each of the buffer amplifiers 101–1XX, 111 and 112. The overbar shown on each instance of this signal signifies that the magnitude of this signal varies inversely with the uncorrected value of the output offset that it controls.

Referring next to FIG. 2B, a dummy buffer amplifier 110 supplies one of the inputs to offset generating amplifier 200. The output, /O, of offset generating amplifier 200 is supplied to all of the buffer amplifiers 101–1XX, 111, and 112 associated with the analog multiplexer 300, as well as to the dummy buffer amplifier 110. A reference voltage generator 400 produces a reference signal, REF, that is one half of the sum of the positive supply voltage, $V_{DD}$, and the negative supply voltage, $V_{SS}$. REF is the input to the dummy buffer amplifier 110 and is one of the two inputs to the offset generating amplifier 200.

Figure 4:
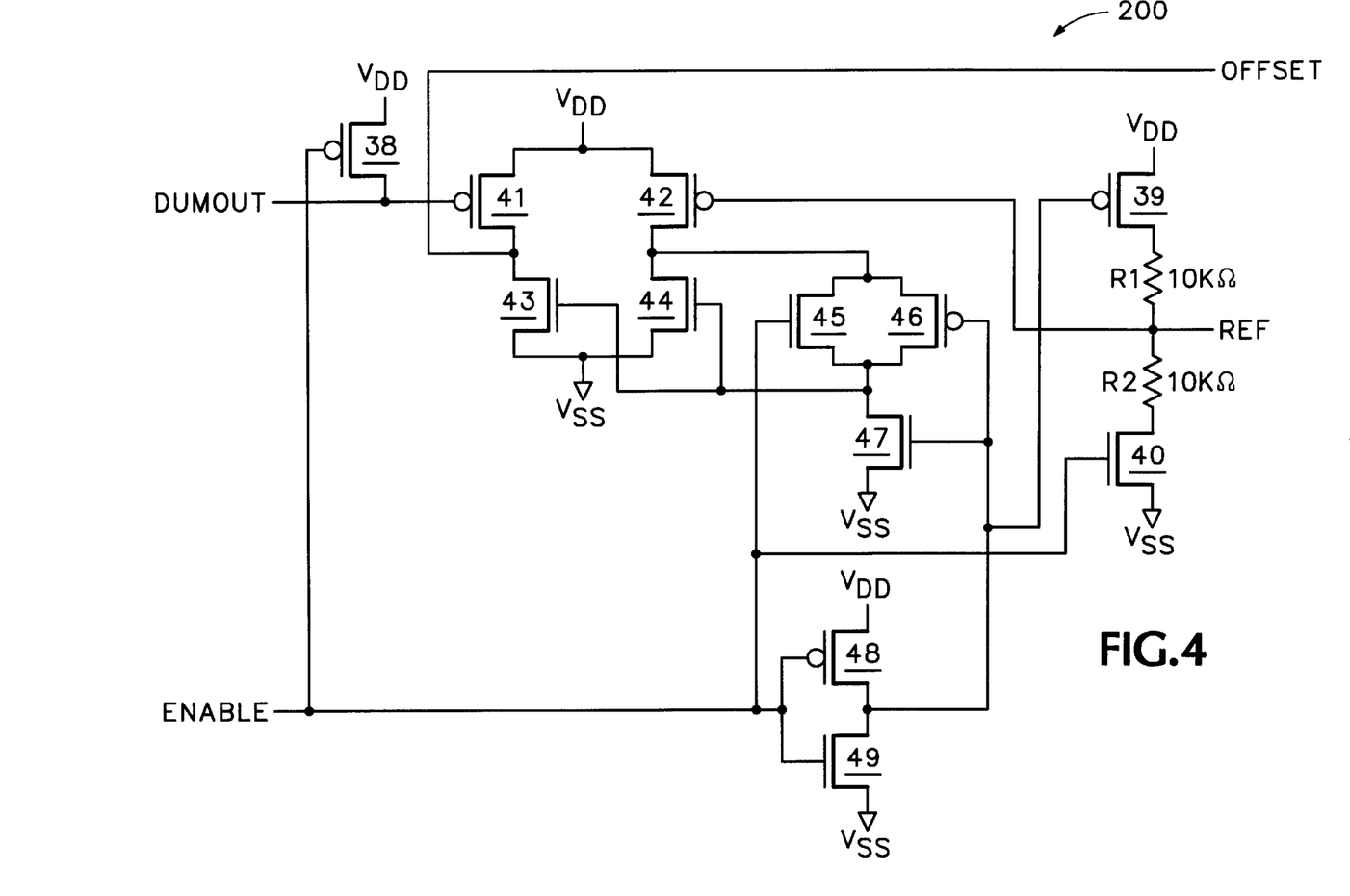
FIG. 4 is a schematic diagram showing the details of the offset generating amplifier and the voltage reference generator.

Referring now to FIG. 4, when the circuitry is enabled by an active high enable signal, transistors 39 and 40 of the reference voltage generator 400 are both turned on. (The enable circuitry that makes this the case will be further discussed below.) With both transistors 39 and 40 on, the REF node is maintained at one half of the voltage difference between $V_{DD}$ and $V_{SS}$, since a 10KΩ resistor connects this node to each of the supply rails. If $V_{DD}$ is 3.3V and $V_{SS}$ is 0.0V, as in our example above, the REF voltage produced will be 1.65V.

In the offset generating amplifier 200, the differential circuit formed by P-channel transistors 41 and 42, with the gate of transistor 42 controlled by the REF signal, will change the offset signal, /O, supplied from the drain of transistor 41 to cause the dummy buffer amplifier 110 to produce a dumout signal that matches the voltage of the REF signal. For a typical case where the REF signal, and therefor the dumout signal, are both 1.65V, the offset signal, /O, is about 1.34V. However, that value could differ significantly with variations in the nature of the implementation, with different processes, or to some extent even with different fabrication runs.

When the enable signal input to the circuitry shown in FIG. 4 is an active high, P-channel transistors 38 and 48 are held off, and N-channel transistors 45, 49, and 40 are held on. With transistor 48 off and transistor 49 on, a low signal holds P-channel transistors 46 and 39 on, and holds N-channel transistor 47 off. With transistors 39 and 40 on, each of the 10KΩ resistors tied to the REF signal node are connected to their respective power supplies, and the REF signal will be the average of the voltages presented by those supplies. With transistors 45 and 46 both on and transistor 47 off, the signal present at the drain of transistor 42 and the drain of transistor 44 will be effectively connected to the gates of transistors 43 and 44, thereby allowing transistors 41 and 42 to conduct. The high on the gate of transistor 38 keeps it off, permitting the dumout signal to reach the gate of transistor 41.

When the enable signal input to the circuitry shown in FIG. 4 is an inactive low, P-channel transistors 38 and 48 are held on, and N-channel transistors 45 and 40 are held off. With transistor 48 on and transistor 49 off, a high signal holds P-channel transistors 46 and 39 off, and holds N-channel transistor 47 on. With transistors 39 and 40 both off, the REF signal node is isolated from both power supplies and will float. With transistors 45 and 46 both off and transistor 47 on, a low will be applied to the gates of transistors 43 and 44 shutting both of them off, and thereby also preventing current flow through transistors 41 and 42. The low on the gate of transistor 38 keeps it turned on, thereby applying a high to the gate of P-channel transistor 41 and keeping it shut off. Thus, when it is low, the enable signal prevents all current flow in the circuitry of offset generating amplifier 200 and the reference voltage generator 400.

While a preferred embodiment of the present invention has been shown and described, it will be apparent to those skilled in the art that many changes and modifications may be made without departing from the invention in its broader aspects. The claims that follow are therefore intended to cover all such changes and modifications as are permitted by the patents laws of the respective countries in which this patent is granted.

I claim:

1. A CMOS buffer amplifier having a signal input node and a signal output node, said amplifier comprising:

a first differential amplifier, having a first input of a first polarity and a second input of an opposite polarity, and an output;

a second differential amplifier, having a first input of a first polarity and a second input of an opposite polarity, and an output, the second differential amplifier having characteristics similar the first differential amplifier;

signal combining circuitry having first and second inputs and an output, the first input being coupled to receive the output of the first differential amplifier, the second input being coupled to receive the output of the second differential amplifier, and the output being coupled to the signal output node;

a first input transducing device suitable for operation in a first voltage range, having an input coupled to the signal input node and an output coupled to the first input of the first differential amplifier;

a second input transducing device suitable for operation in the first voltage range, having an input coupled to the signal output node and an output coupled to the second input of the first differential amplifier;

a first input transducing device suitable for operation in a second voltage range, having an input coupled to the signal input node and an output coupled to the first input of the second differential amplifier; and a second input transducing device suitable for operation in the second voltage range, having an input coupled to the signal output node and an output coupled to the second input of the second differential amplifier.

2. A CMOS buffer amplifier according to claim 1 wherein the first voltage range and the second voltage range overlap in a central voltage region.

3. A CMOS buffer amplifier according to claim 1 wherein the first and second input transducing devices suitable for operation in the first voltage range are equally weighted so as to produce a gain of one, and the first and second input transducing devices suitable for operation in the second voltage range are equally weighted so as to produce a gain of one.

4. A CMOS buffer amplifier according to claim 1 wherein a nominal voltage output level of the signal output node is responsive to an offset signal.

5. A CMOS buffer amplifier according to claim 1 wherein the signal combining circuit comprises:
   a pull-up circuit, having an input coupled to the output of the first differential amplifier and an output coupled to the signal output node; and
   a pull-down circuit, having an input coupled to the output of the second differential amplifier and an output coupled to the signal output node, the pull-down circuit having characteristics similar the pull-up circuit.

6. A CMOS buffer amplifier according to claim 1 wherein the first input transducing device suitable for operation in the first voltage range and the second input transducing device suitable for operation in the first voltage range have similar characteristics.

7. A CMOS buffer amplifier according to claim 2 wherein the first input transducing device suitable for operation in the second voltage range and the second input transducing device suitable for operation in the first voltage range have similar characteristics.

8. A CMOS buffer amplifier according to claim 3 wherein the first input transducing device suitable for operation in the first voltage range and the second input transducing device suitable for operation in the first voltage range have similar characteristics.

9. A CMOS buffer amplifier according to claim 4 wherein the first input transducing device suitable for operation in the second voltage range and the second input transducing device suitable for operation in the first voltage range have similar characteristics.

10. A CMOS buffer amplifier according to claim 5 wherein the first input transducing device suitable for operation in the second voltage range and the second input transducing device suitable for operation in the first voltage range have similar characteristics.

11. A CMOS buffer amplifier according to claim 6 wherein the first and second input transducing devices suitable for operation in the first voltage range and the first and second input transducing devices suitable for operation in the second voltage range have similar characteristics except for those necessary to provide for different operating voltage ranges.

12. A CMOS buffer amplifier according to claim 7 wherein the first and second input transducing devices suitable for operation in the first voltage range and the first and second input transducing devices suitable for operation in the second voltage range have similar characteristics except for those necessary to provide for different operating voltage ranges.

13. A CMOS buffer amplifier according to claim 8 wherein the first and second input transducing devices suitable for operation in the first voltage range and the first and second input transducing devices suitable for operation in the second voltage range have similar characteristics except for those necessary to provide for different operating voltage ranges.

14. A CMOS buffer amplifier according to claim 9 wherein the first and second input transducing devices suitable for operation in the first voltage range and the first and second input transducing devices suitable for operation in the second voltage range have similar characteristics except for those necessary to provide for different operating voltage ranges.

15. A CMOS buffer amplifier according to claim 10 wherein the first and second input transducing devices suitable for operation in the first voltage range and the first and second input transducing devices suitable for operation in the second voltage range have similar characteristics except for those necessary to provide for different operating voltage ranges.

16. A CMOS buffer amplifier according to claim 2 wherein a nominal voltage output level of the signal output node is responsive to an offset signal.

17. A CMOS buffer amplifier according to claim 3 wherein a nominal voltage output level of the signal output node is responsive to an offset signal.

18. A CMOS buffer amplifier according to claim 5 wherein a nominal voltage output level of the signal output node is responsive to an offset signal.

19. A CMOS buffer amplifier according to claim 7 wherein a nominal voltage output level of the signal output node is responsive to an offset signal.

20. A CMOS buffer amplifier according to claim 8 wherein a nominal voltage output level of the signal output node is responsive to an offset signal.

21. A CMOS buffer amplifier according to claim 10 wherein a nominal voltage output level of the signal output node is responsive to an offset signal.

22. A CMOS buffer amplifier according to claim 11 wherein a nominal voltage output level of the signal output node is responsive to an offset signal.

23. A CMOS buffer amplifier according to claim 12 wherein a nominal voltage output level of the signal output node is responsive to an offset signal.

24. A CMOS buffer amplifier according to claim 14 wherein a nominal voltage output level of the signal output node is responsive to an offset signal.

25. A CMOS buffer amplifier according to claim 5 wherein a nominal voltage level of the output of the signal combining circuitry is responsive to an offset signal.

26. A CMOS buffer amplifier according to claim 10 wherein a nominal voltage level of the output of the signal combining circuitry is responsive to an offset signal.

27. A CMOS buffer amplifier according to claim 15 wherein a nominal voltage level of the output of the signal combining circuitry is responsive to an offset signal.

28. A CMOS buffer amplifier according to claim 5 wherein a nominal voltage level of the output of the signal output node is responsive to an offset signal.

29. A CMOS buffer amplifier according to claim 10 wherein a nominal voltage level of the output of the signal output node is responsive to an offset signal.

30. A CMOS buffer amplifier according to claim 15 wherein a nominal voltage level of the output of the signal output node is responsive to an offset signal.

31. A CMOS buffer amplifier according to claim 1 wherein the input transducing devices are voltage-to-current converters.

32. A CMOS buffer amplifier according to claim 31 wherein the first voltage range and the second voltage range overlap in a central voltage region.

33. A CMOS buffer amplifier according to claim 31 wherein the first and second input transducing devices suitable for operation in the first voltage range are equally weighted so as to produce a gain of one, and the first and second input transducing devices suitable for operation in the second voltage range are equally weighted so as to produce a gain of one.

34. A CMOS buffer amplifier according to claim 31 wherein a nominal voltage output level of the signal output node is responsive to an offset signal.

35. A CMOS buffer amplifier according to claim 31 wherein the signal combining circuit comprises:

a pull-up circuit, having an input coupled to the output of the first differential amplifier and an output coupled to the signal output node; and a pull-down circuit, having an input coupled to the output of the second differential amplifier and an output coupled to the signal output node, the pull-down circuit having characteristics similar the pull-up circuit.

* * * * *

UNITED STATES PATENT AND TRADEMARK OFFICE
CERTIFICATE OF CORRECTION

PATENT NO : 5,949,284
DATED : September 7, 1999
INVENTOR(S) : Arnold M. Frisch

It is certified that error appears in the above-identified patent and that said Letters Patent are hereby corrected as shown below:

Column 1, after line 2 insert the following:

"STATEMENT REGARDING FEDERALLY SPONSORED RESEARCH OR DEVELOPMENT

This invention was made with Government support under Agreement No. F33615-94-C-4401 awarded by Department of Air Force. The Government has certain rights in the invention."

Signed and Sealed this

Tenth Day of April, 2001

Attest:

NICHOLAS P. GODICI

Attesting Officer    Acting Director of the United States Patent and Trademark Office